(12) United States Patent
Kawamura

(10) Patent No.: US 6,975,031 B2
(45) Date of Patent: Dec. 13, 2005

(54) SEMICONDUCTOR DEVICE AND CHIP CARRIER

(75) Inventor: Hiromitsu Kawamura, Yamanashi (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 484 days.

(21) Appl. No.: 10/060,323

(22) Filed: Feb. 1, 2002

(65) Prior Publication Data

US 2002/0105045 A1 Aug. 8, 2002

(30) Foreign Application Priority Data

Feb. 5, 2001 (JP) ............................... 2001-28881

(51) Int. Cl.⁷ ..................... H01L 23/48; H01L 23/52; H01L 29/40; H01C 7/10
(52) U.S. Cl. .................. 257/741; 257/775; 338/22 SD; 338/23
(58) Field of Search .............. 338/22 SD, 23; 257/741, 775

(56) References Cited

U.S. PATENT DOCUMENTS

| | | | | |
|---|---|---|---|---|
| 4,359,372 A | * | 11/1982 | Nagai et al. ............ 204/192.21 |
| 5,045,866 A | * | 9/1991 | Chiba et al. ................ 347/232 |
| 5,066,938 A | * | 11/1991 | Kobashi et al. ......... 338/22 SD |
| 5,254,968 A | * | 10/1993 | Zirnheld ....................... 338/50 |
| 5,635,893 A | * | 6/1997 | Spraggins et al. ............ 338/48 |
| 5,763,929 A | * | 6/1998 | Iwata .......................... 257/467 |
| 5,847,436 A | * | 12/1998 | Iwata .......................... 257/467 |
| 5,962,854 A | * | 10/1999 | Endo .......................... 250/349 |
| 6,166,619 A | * | 12/2000 | Baiatu et al. .................. 338/61 |
| 6,316,770 B1 | * | 11/2001 | Ouvrier-Buffet et al. 250/338.1 |
| 6,348,650 B1 | * | 2/2002 | Endo et al. .................. 136/201 |
| 6,455,823 B1 | * | 9/2002 | Bulgajewski et al. ....... 219/548 |
| 6,475,604 B1 | * | 11/2002 | Fujii et al. ................... 428/209 |
| 6,550,325 B1 | * | 4/2003 | Inushima et al. ......... 73/204.26 |

FOREIGN PATENT DOCUMENTS

| | | |
|---|---|---|
| EP | 0 259 888 | 3/1988 |
| EP | 0 467 359 | 1/1992 |
| JP | 6-61012 | 3/1994 |

OTHER PUBLICATIONS

Copy of European Patent Office Communication including European Search Report for corresponding European Patent Application No. 02250736 dated Apr. 16, 2002.

* cited by examiner

*Primary Examiner*—David E. Graybill
(74) *Attorney, Agent, or Firm*—Armstrong, Kratz, Quintos, Hanson & Brooks, LLP

(57) ABSTRACT

There are provided a carrier substrate, a temperature sensing resistor film formed directly on the carrier substrate, first and second conductive patterns formed on the carrier substrate and connected to both ends of the temperature sensing resistor film respectively, and a semiconductor chip mounting region portion formed on the carrier substrate.

8 Claims, 4 Drawing Sheets

SEMICONDUCTOR DEVICE AND CHIP CARRIER

CROSS-REFERENCE TO RELATED APPLICATIONS

This application is based upon and claims priority of Japanese Patent Application No. 2001-28881, filed in Feb. 5, 2001, the contents being incorporated herein by reference.

BACKGROUND OF THE INVENTION

1. Field of the Invention

The present invention relates to a semiconductor device and a chip carrier and, more particularly, a structure of a temperature sensor portion of the semiconductor device, for example, a structure of a thermistor element portion employed in temperature control of a laser chip of a semiconductor light emitting device as the major application mode.

2. Description of the Prior Art

In order to control the temperature of the laser chip in operation, for example, a thermistor is brazed to a ceramic carrier onto which a semiconductor light emitting element, e.g., a laser chip, is mounted, as shown in FIG. 1.

In FIG. 1, a rectangular first conductive pattern 102a and an L-shaped second conductive pattern 102b are formed in a first region that is positioned near one end on a major surface of a ceramic carrier 101. Also, a rectangular third conductive pattern 102c is formed in a second region that is positioned near the other end on the major surface.

A lower electrode 103a of the laser chip 103 is connected to such second conductive pattern 102b by a conductive brazing material 104, and also a first gold wire 105a is connected to such second conductive pattern 102b by the bonding. Second and third gold wires 105b, 105c that relay the first conductive pattern 102a are electrically connected to an upper electrode 103b of the semiconductor laser 103.

Also, a thermistor 106 is connected to the third conductive pattern 102c, so that the temperature is sensed in response to change in its resistance.

The thermistor 106 has first and second electrodes 106b, 106c formed on a major surface of a ceramic substrate 106a, and a thermistor element 106d connected to these first and second electrodes 106b, 106c. The thermistor having such structure is set forth in Patent Application Publication (KO-KAI) Hei 6-61012, for example.

Then, a bottom surface of the ceramic substrate 106a is connected to the third conductive pattern 102c via a solder 107. Also, fourth and fifth gold wires are bonded to the first and second electrodes 106b, 106c respectively and then extended electrically to the outside therefrom. In this case, the third conductive pattern 102c is formed to improve the adhesiveness between the ceramic substrate 106a and the ceramic carrier 101.

However, in the above structure, a thermal resistance of a solder 107, that is interposed between the ceramic carrier 101 and the thermistor element 106d, is changed time-dependently due to the change in microstructure or the progress of crack caused by the solder creep after the semiconductor light emitting device is operated.

Therefore, the resistance value of the thermistor element 106d to sense the temperature of the laser chip 103 is changed with the lapse of the operation years of the semiconductor light emitting device.

SUMMARY OF THE INVENTION

It is an object of the present invention to provide a semiconductor device and a chip carrier, which is capable of controlling a temperature of a semiconductor chip with high precision.

The above subject can be overcome by providing a semiconductor device which comprises a carrier substrate, a temperature sensing resistive element deposited on the carrier substrate, a semiconductor element mounting portion laid on the carrier substrate, and a semiconductor element mounted on the mounting portion.

In the above semiconductor device, the carrier substrate is formed of ceramics.

Also, in the above semiconductor device, conductive patterns that are formed on the carrier substrate and connected to the temperature sensing resistive element are further comprised. In this case, each of the conductive patterns has a bonding point that is electrically connected to an outside, and a portion having low thermal conductivity is interposed into each of the conductive patterns between the bonding point and the temperature sensing resistive element. The portion having the low thermal conductivity is a bent portion of each of the conductive patterns. Also, the portion having the low thermal conductivity is a small width portion of each of the conductive patterns.

In the above semiconductor device, the temperature sensing resistive element contains at least one of Mn, Ni, Co, and Fe.

Also, in the above semiconductor device, the semiconductor element is a semiconductor laser. In this case, a heat sink is interposed between the semiconductor laser and the mounting portion.

The above subject can be overcome by providing a chip carrier which comprises a carrier substrate, a temperature sensing resistive element deposited on the carrier substrate, and a semiconductor element mounting portion laid on the carrier substrate.

In the above chip carrier, the carrier substrate is formed of ceramics.

In the above chip carrier, conductive patterns that are formed on the carrier substrate and connected to the temperature sensing resistive element are further comprised. In this case, each of the conductive patterns has a bonding point that is electrically connected to an outside, and a portion having low thermal conductivity is interposed into each of the conductive patterns between the bonding point and the temperature sensing resistive element. Also, the portion having the low thermal conductivity is a bent portion of each of the conductive patterns. Also, the portion having the low thermal conductivity is a small width portion of each of the conductive patterns.

In the above chip carrier, the temperature sensing resistive element is formed through the step of sintering on the carrier substrate. In this case, the temperature sensing resistive element contains at least one of Mn, Ni, Co, and Fe.

According to the present invention, the temperature sensing resistor film (thermistor) is formed directly and monolithically onto the carrier substrate on which the semiconductor element (e.g., semiconductor laser chip) is mounted.

Therefore, in the case that the temperature of the semiconductor element transmitted via the carrier substrate is sensed by the temperature sensing resistor film, the thermal resistance between the temperature sensing resistor film and the carrier substrate is never changed even after the operation hours of the semiconductor chip has lapsed.

As a result, the temperature of the laser chip can be controlled without variation in a longer term than the prior art and with high precision.

DESCRIPTION OF THE PREFERRED EMBODIMENT

An embodiment of the present invention will be explained with reference to the accompanying drawings hereinafter.

Figure 1:
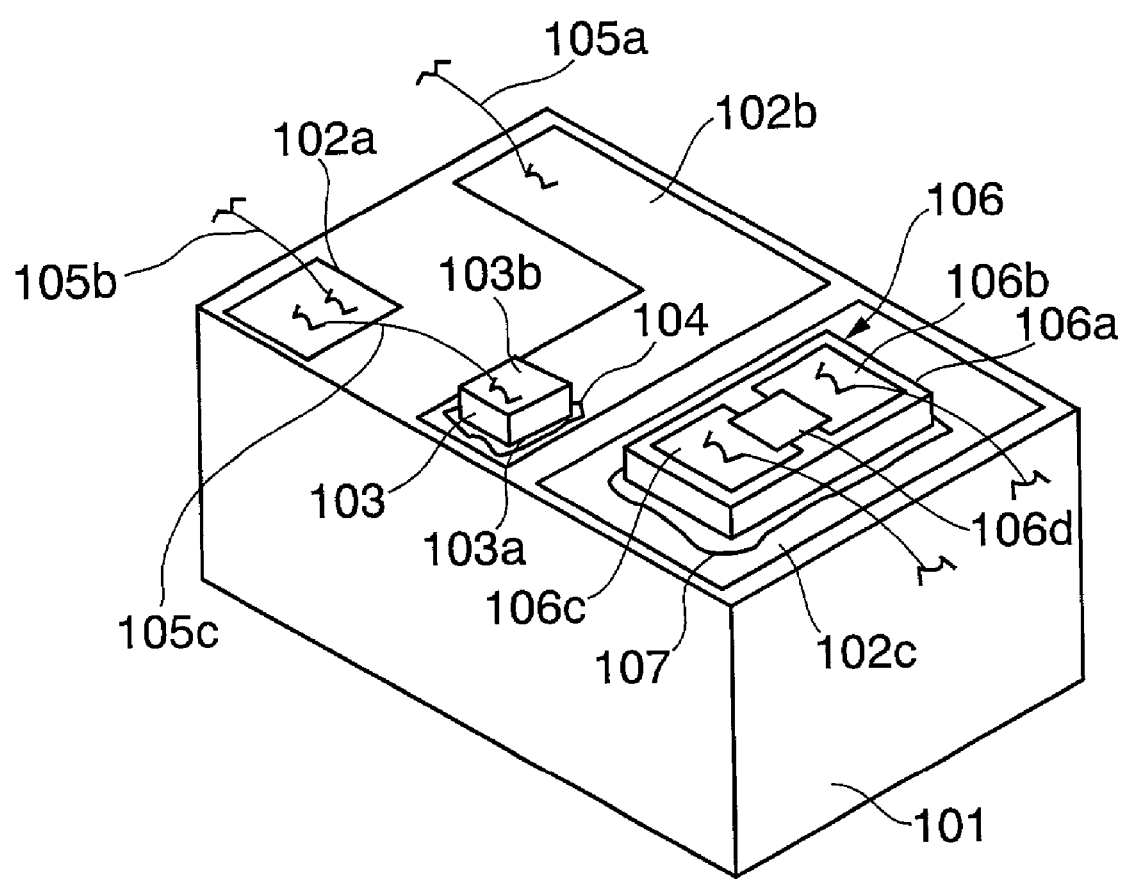
FIG. 1 is a perspective view showing the semiconductor light emitting device in the prior art.
Figure 2:
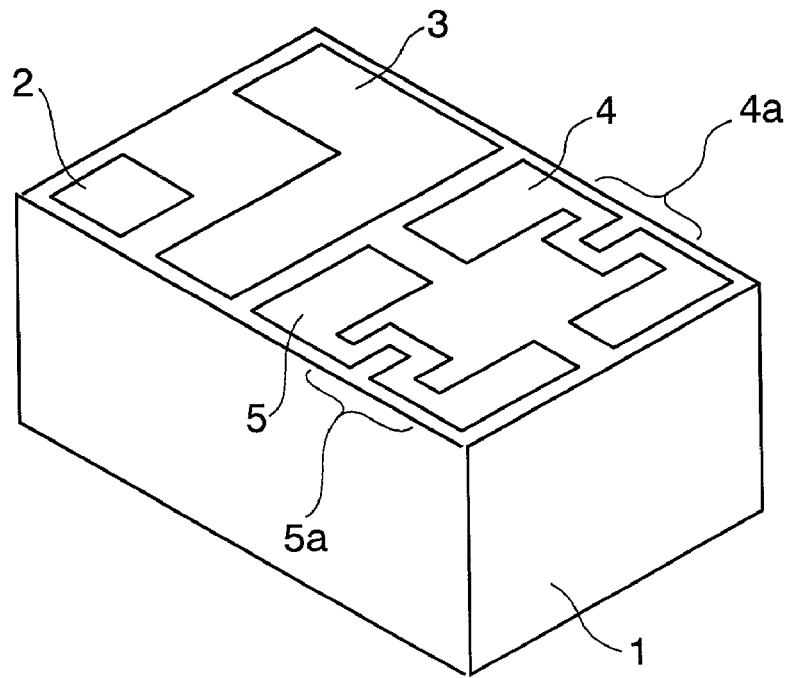
FIG. 2 to FIG. 4 are perspective views showing steps of manufacturing a semiconductor light emitting device according to an embodiment of the present invention.
Figure 3:
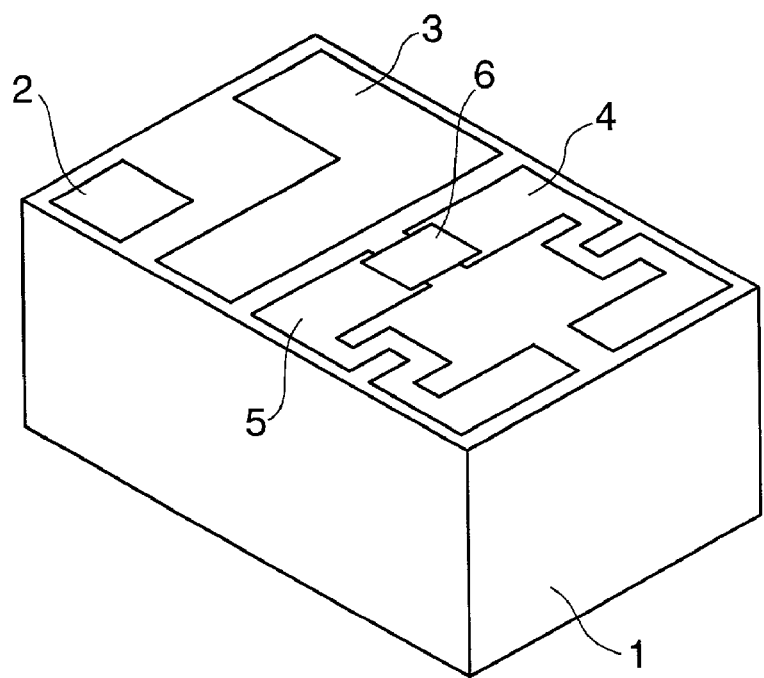
Figure 4:
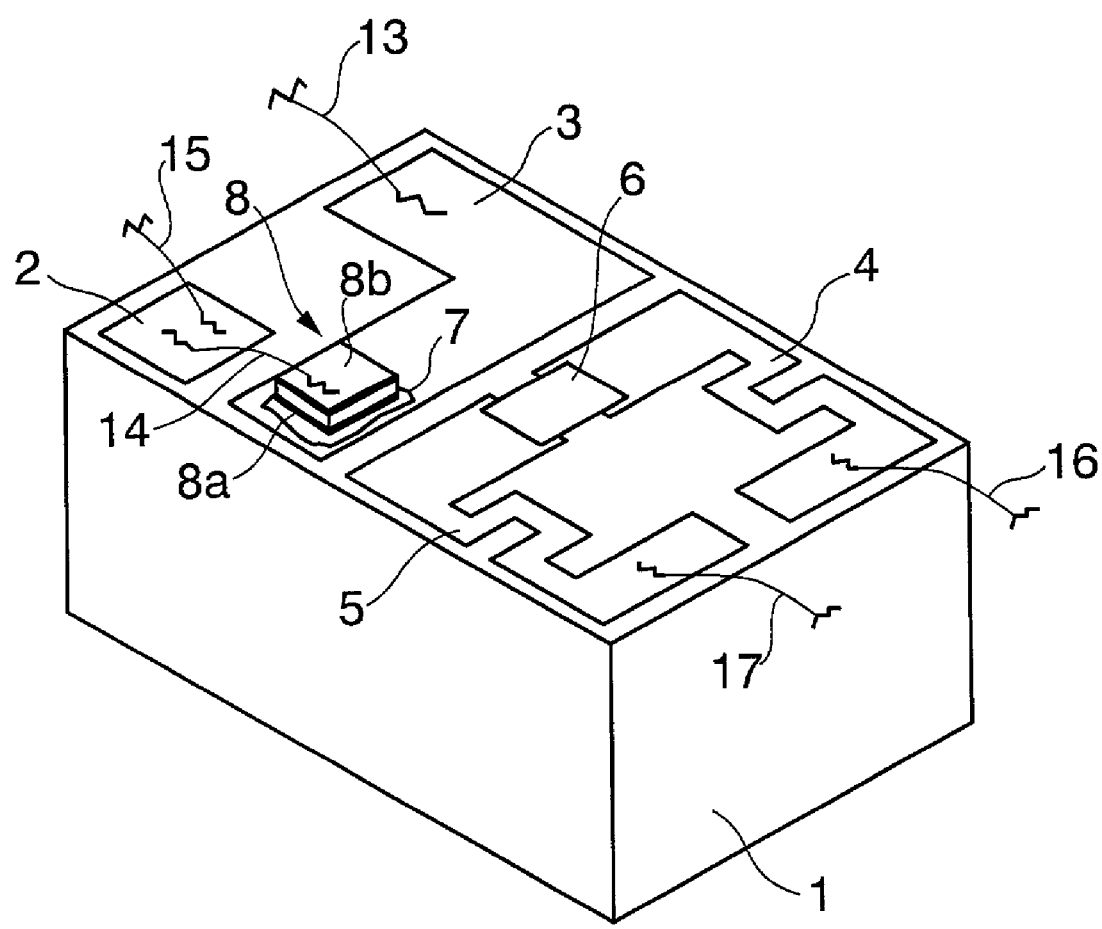

FIG. 2 to FIG. 4 are perspective views showing steps of manufacturing a semiconductor light emitting device according to an embodiment of the present invention.

Steps required to get the state shown in FIG. 2 will be explained hereunder.

First, a metal film is formed on a major surface of a ceramic carrier (substrate) 1 formed of ceramics such as alumina, aluminium nitride, etc. This metal film is formed by sputtering sequentially titanium and platinum on the ceramic carrier 1, for example.

Then, a resist pattern (not shown) of wirings and pads is formed on the metal film, and then the metal film in regions that are not covered with the resist pattern is removed by the sputter etching. Thus, an island-like first conductive pattern 2 is formed at one corner positioned near one end of the major surface of the ceramic carrier 1, and also an L-shaped second conductive pattern 3, on which the laser chip is mounted, is formed at a distance around the first conductive pattern 2. Also, a third conductive pattern 4 and a fourth conductive pattern 5, which extend while bending zigzag along both sides of the ceramic carrier 1, are formed at a distance in the region near the other end of the major surface of the ceramic carrier 1. End portions of the third and fourth conductive patterns 4, 5 positioned near the other end of the ceramic carrier 1 are formed as wire-bonding portions for locating wire-bonding points. Also, portions 4a, 5a in the middle of the third and fourth conductive patterns 4, 5, which are directed in a path having bends, are portions having the low thermal conductivity and have a pattern width that is narrower than that of both end portions.

Then, a sintered film that is made of single or composite oxide containing at least one of manganese (Mn), nickel (Ni), cobalt (Co), iron (Fe), etc. is formed directly on the major surface of the ceramic carrier 1 and the first to fourth conductive pattern electrodes 2 to 5 by the sputtering to have a thickness of 0.1 to 2.0 μm. Then, the sintered film is burned by heating at several hundreds ° C. for several hours.

In turn, as shown in FIG. 3, the sintered film is patterned by the photolithography method such that such sintered film remains in a temperature sensing resistive element portion of the third and fourth conductive patterns 4, 5 that are located on one end portion of the conductive patterns near the center of the ceramic carrier 1 and between the third and fourth conductive patterns 4, 5. Thus, a thermistor element 6 made of the sintered film (temperature-sensing resistor film) whose both ends are connected to the third and fourth conductive patterns 4, 5 respectively is formed monolithically on the major surface of the ceramic carrier 1. Accordingly, a thermistor carrier having a laser chip mounting region (semiconductor element mounting portion) can be completed.

Then, as shown in FIG. 4, a laser chip 8 is jointed to the second conductive pattern 3 by using a solder 7. In this case, a second electrode 8b of the laser chip 8 is positioned upwardly by jointing a first electrode 8a of the laser chip 8 to the second conductive pattern 3. A heat sink (not shown) may be interposed between the laser chip 8 and the ceramic carrier 1.

The structure in which the laser chip is fitted on the thermistor carrier is completed through the above steps.

Figure 5:
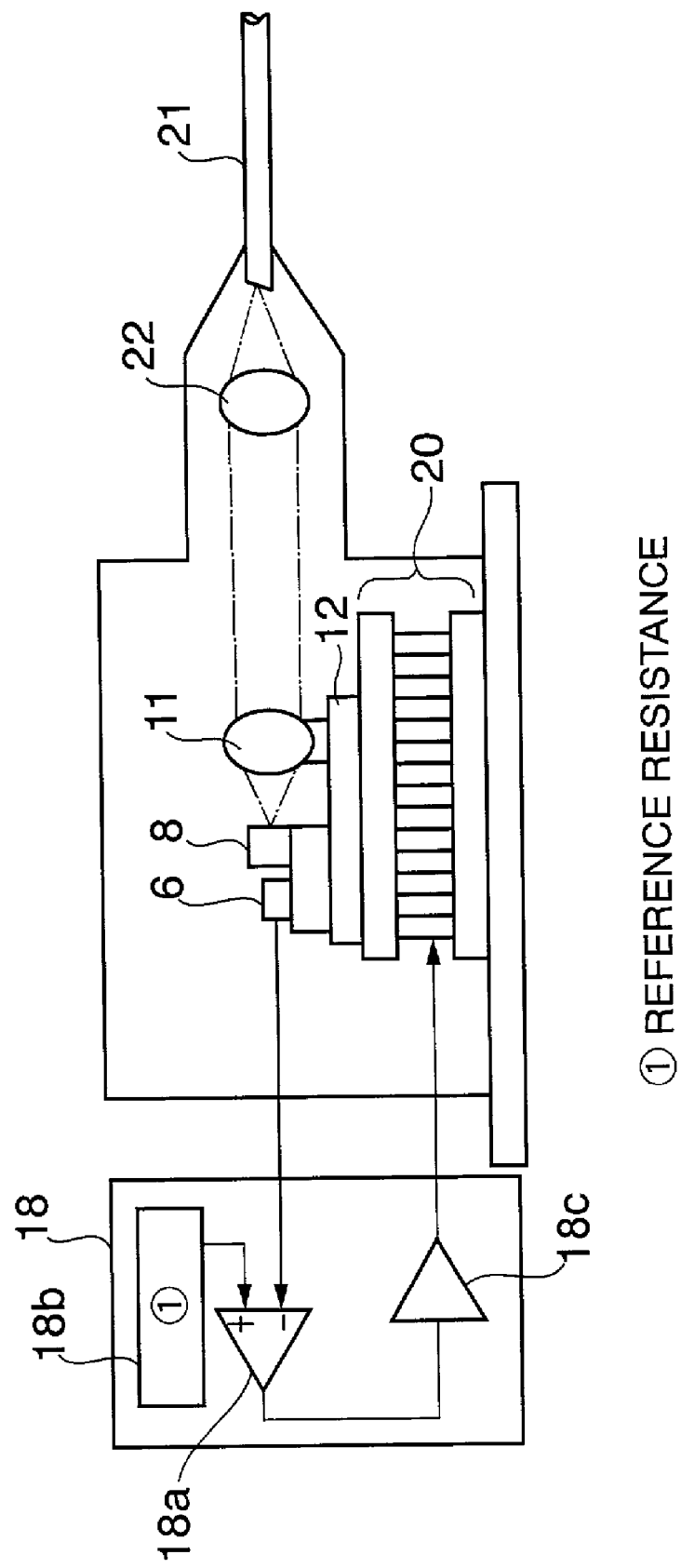
FIG. 5 is a side view showing the application state of the semiconductor light emitting device according to the embodiment of the present invention.

As shown in FIG. 5, the above structure as well as a first lens 11 is fitted onto an insulating substrate 12, and then fixed at such a position that an output end of the laser chip 8 is directed toward the first lens 11. The insulating substrate 12 is fitted onto a Peltier element 20.

Meanwhile, in the structure shown in FIG. 4, a first gold wire 13 is bonded to the wire bonding point of the second conductive pattern 3, which is near one end of the ceramic carrier 1, and also is connected to an external laser driving circuit (not shown). Also, a second gold wire 14 is bonded to the second electrode 8b of the laser chip 8 and the first conductive pattern 2, and then a third gold wire 15 is bonded to the first conductive pattern 2 and also is connected to an external laser driving circuit 18.

In addition, a fourth gold wire 16 and a fifth gold wire 17 are bonded respectively to other end portions of the third and fourth conductive patterns 4, 5, to one end portions of which the thermistor element 6 is connected, and also connected to a differential amplifier 18a of a temperature control circuit 18 shown in FIG. 5. That is, the thermistor element 6 is connected to the differential amplifier 18a of the temperature control circuit 18 via the gold wires 16, 17 and the third and fourth conductive patterns 4, 5.

The differential amplifier 18a can set the temperature of the ceramic carrier 1, i.e., the temperature of the laser chip 8, to a predetermined temperature by comparing the resistance of the thermistor element 6 with a reference resistance value of a reference resistor 18b, then adjusting a current value to the Peltier element (temperature heating/cooling element) 20 via an amplifier 18c so as to reduce a reference difference to zero, and then controlling the temperature of the Peltier element 20 such that the thermistor element 6 has the reference resistance value. The reference resistance value of the reference resistor 18b is previously set to the resistance value of the thermistor element 6 when the temperature of the laser chip 8 is 25° C., for example.

In the above optical module, the thermistor element 6 is formed directly and monolithically on the ceramic carrier 1, on which the laser chip 8 is mounted, without the intervention of the solder or the brazing material whose thermal resistance is easily changed. Therefore, the temperature of the laser chip 8 can always be sensed with good precision via the ceramic carrier 1 irrespective of the lapse of the driving time of the laser chip 8, whereby the cooling or heating control of the laser chip 8 made by the temperature control circuit 18 and the Peltier element 20 can be executed with high precision.

As a result, since the change in microstructure or the progress of crack caused due to the solder creep is not caused after the laser chip is operated, the temperature of the laser chip 8 fitted onto the ceramic carrier 1 is not varied for a long term and is kept constant, and thus the optical characteristic of the laser chip 8 can be maintained constant.

In FIG. 5, a reference 21 denotes an optical fiber that is connected optically to the first lens 11 via the second lens 22.

In the above embodiment, the laser chip (semiconductor laser) is fitted to the semiconductor mounting region on the thermistor carrier. But the temperature of the semiconductor element may be controlled constant by fitting other semiconductor element onto the semiconductor mounting region.

As described above, according to the present invention, the temperature sensing resistive element is formed directly and monolithically onto the carrier substrate on which the semiconductor chip (e.g., semiconductor laser chip) is mounted. Therefore, in the case that the temperature of the semiconductor chip transmitted via the carrier substrate is sensed by the temperature sensing resistor film, the change in the thermal resistance between the temperature sensing resistor film and the carrier substrate can be prevented even when the operation time of the semiconductor chip becomes longer, so that the temperature of the semiconductor device can be controlled without the variation in a longer term than the prior art and with high precision.

What is claimed is:

1. A semiconductor device, comprising:
   a carrier substrate;
   a temperature sensing resistive element deposited directly on the carrier substrate;
   a semiconductor element mounting portion laid on the carrier substrate;
   a semiconductor element mounted on the semiconductor element mounting portion; and
   conductive patterns that are formed on the carrier substrate and connected with the temperature sensing resistive element at a temperature sensing resistive element portion thereof, which is of a selected width, wherein each of the conductive patterns has a wire-bonding point, connected at a wire-bonding point portion of a selected width, that is electrically connected to an outside, and has a portion between the wire-bonding point portion and the temperature sensing resistive element portion, having a lower thermal conductivity than said wire-bonding point portion and said temperature sensing resistive element portion.

2. A semiconductor device according to claim 1, wherein the carrier substrate is formed of ceramics.

3. A semiconductor device according to claim 1, further comprising conductive patterns that are formed on the carrier substrate and connected with the temperature sensing resistive element at a temperature sensing resistive element portion thereof, which is of a selected width.

4. A semiconductor device according to claim 1, wherein the portion having the lower thermal conductivity is a portion directed in a path having bends.

5. A semiconductor device according to claim 1, wherein the portion having the lower thermal conductivity is of a width smaller than widths of said wire-bonding point portion and said temperature sensing resistive element portion.

6. A semiconductor device according to claim 1, wherein the temperature sensing resistive element contains at least one of Mn, Ni, Co, and Fe.

7. A semiconductor device according to claim 1, wherein the semiconductor element is a semiconductor laser.

8. A semiconductor device according to claim 7, wherein a heat sink is interposed between the semiconductor laser and the mounting portion.

* * * * *